US008093908B1

(12) United States Patent
Smith, Jr.

(10) Patent No.: US 8,093,908 B1
(45) Date of Patent: Jan. 10, 2012

(54) METHOD AND APPARATUS FOR MEASURING ELECTRICAL IMPEDANCE OF THIN FLUID FILMS

(75) Inventor: Jerry Rosson Smith, Jr., Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 825 days.

(21) Appl. No.: 12/221,146

(22) Filed: Jul. 24, 2008

Related U.S. Application Data

(60) Provisional application No. 61/132,336, filed on Jun. 11, 2008.

(51) Int. Cl.
*G01R 27/00* (2006.01)
(52) U.S. Cl. .............................. 324/600; 324/661
(58) Field of Classification Search ............ 324/600
See application file for complete search history.

(56) References Cited

U.S. PATENT DOCUMENTS

| | | | |
|---|---|---|---|
| 3,660,250 A | | 5/1972 | Duffy et al. |
| 3,770,605 A | * | 11/1973 | McCoy ........................ 204/562 |
| 4,299,114 A | * | 11/1981 | Silvermetz et al. ............ 73/1.83 |
| 4,806,847 A | * | 2/1989 | Atherton et al. ............ 73/304 C |
| 5,187,096 A | | 2/1993 | Giaever et al. |
| 5,442,297 A | | 8/1995 | Verkuil |
| 5,698,989 A | | 12/1997 | Nulman |
| 6,437,551 B1 | * | 8/2002 | Krulevitch et al. .......... 324/71.1 |
| 6,782,747 B2 | * | 8/2004 | Gundlach et al. ............ 73/304 C |
| 2007/0205772 A1 | * | 9/2007 | Woehrle ........................ 324/519 |

OTHER PUBLICATIONS

U.S. Appl. No. 61/132,336, filed Jun. 2008, entitled "Method and Apparatus for Measuring Electrical Impedance of Thin Fluid Films," sole inventor Jerry Rosson Smith, Jr.
L. J. van der Pauw, "A Method of Measuring the Resistivity and Hall Coefficient on Lamellae of Arbitrary Shape," *Philips Technical Review*, vol. 20, No. 8, 1958-2959, pp. 220-224.
L. J. van der Pauw, "A Method of Measuring Specific Resistivity and Hall Effect of Discs of Arbitrary Shape," *Philips Research Reports*, vol. 13, No. 1, Feb. 1958, pp. 1-9.

* cited by examiner

*Primary Examiner* — Thomas Valone
(74) *Attorney, Agent, or Firm* — Howard Kaiser

(57) ABSTRACT

According to typical inventive practice, the relative positioning of two press members is mechanically adjustable so that their respective flat surfaces remain parallel at selectively closer or further distances apart. During immersion or partial immersion of the two press members in a fluid of interest, a fluid sample is bounded by the two opposing flat surfaces. The present invention can thus achieve small thicknesses of its fluid samples, which represent "thin fluid films" suitable for measurement of one or more electrical characteristics (e.g., impedance, or impedance-related characteristics such as permittivity). Data acquisition can be performed by generating electrical pulses and receiving data signals from probes contiguous with the fluid sample. Measurements can be taken of fluid samples characterized by varying thicknesses and/or varying pressures. As distinguished from conventional methodologies, which are beset with "bubble-bursting" transience and fragility, the inventive methodology provides thin fluid films that are stable and robust.

17 Claims, 17 Drawing Sheets

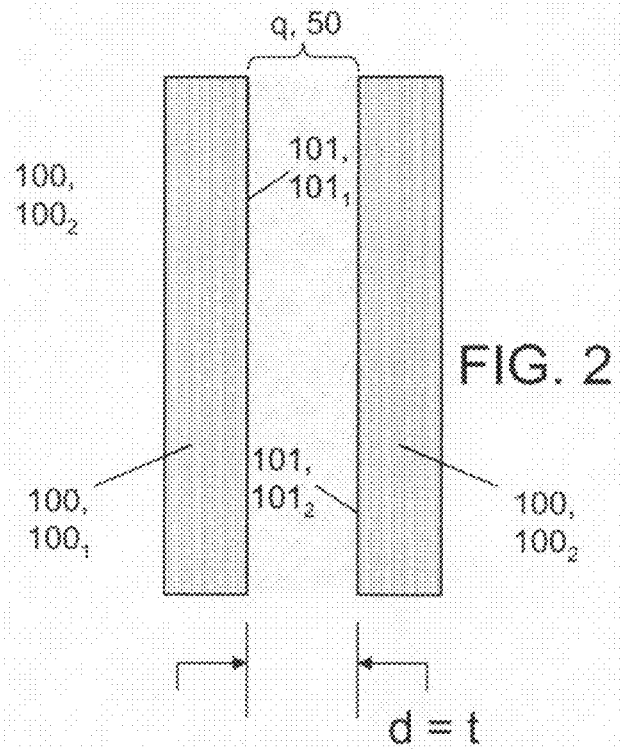
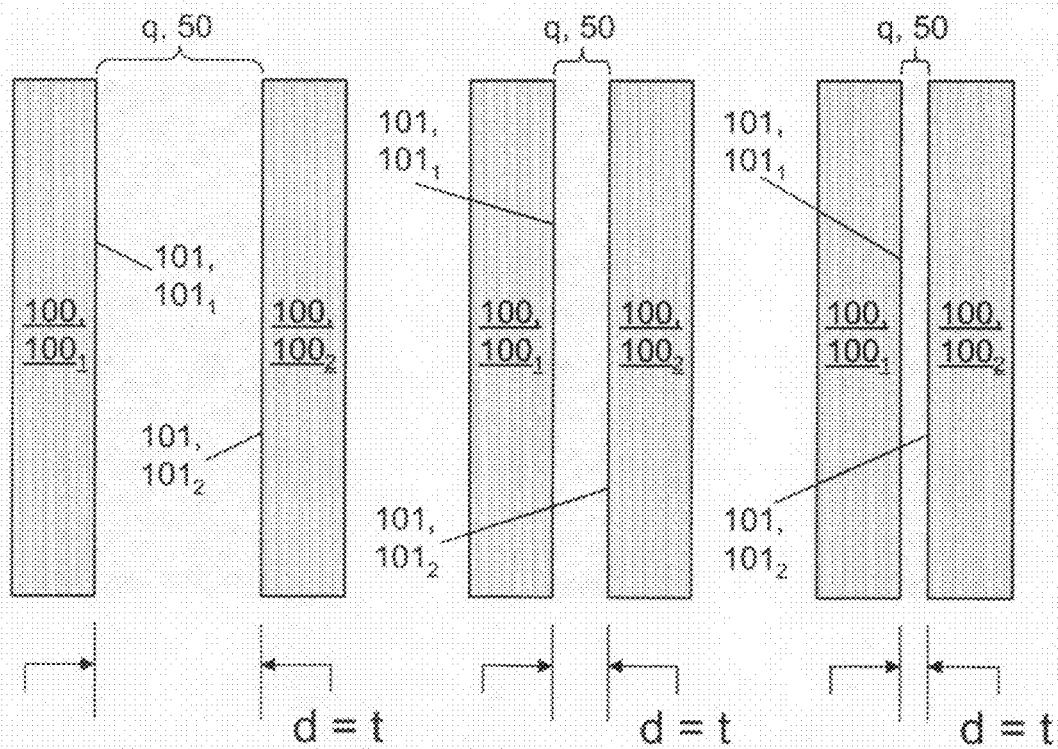
FIG. 1  FIG. 2  FIG. 3  FIG. 4  FIG. 5

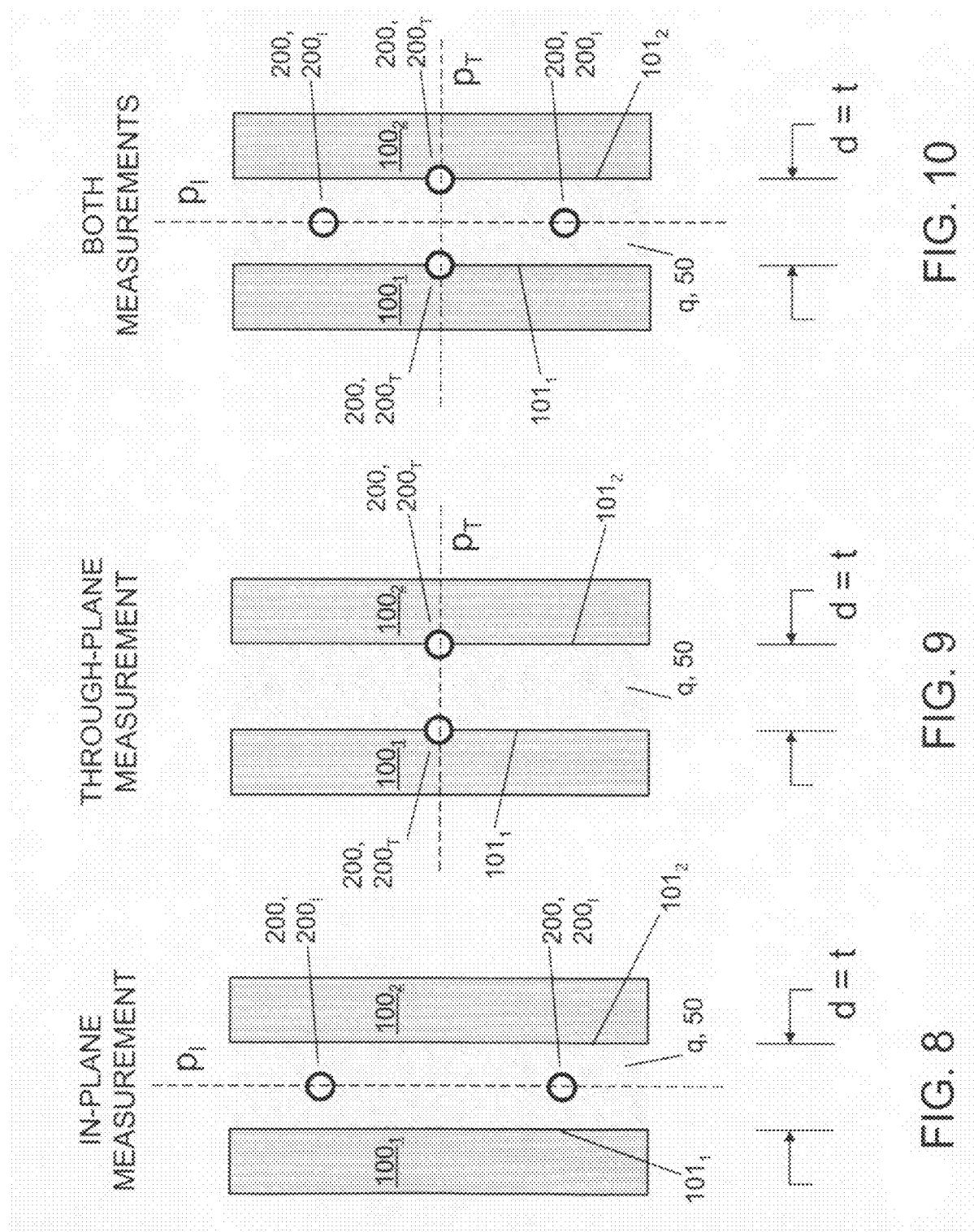

METHOD AND APPARATUS FOR MEASURING ELECTRICAL IMPEDANCE OF THIN FLUID FILMS

CROSS-REFERENCE TO RELATED APPLICATIONS

This application claims the benefit of U.S. provisional patent application No. 61/132,336, hereby incorporated herein by reference, filing date 11 Jun. 2008, invention title "Method and Apparatus for Measuring Electrical Impedance of Thin Fluid Films," sole inventor Jerry Rosson Smith, Jr.

BACKGROUND OF THE INVENTION

The present invention relates to electrical impedance, more particularly to methods and apparatuses for measuring the electrical impedance of a thin film of fluid.

Electrical impedance, typically designated "Z" and expressed in ohms, is the amount of resistance of an electrical circuit to current flow upon the provision of a voltage across a pair of terminals of the electrical circuit. Basically, the impedance of the electrical circuit is the ratio of the voltage across the terminals to the current flow between the terminals. Impedance in direct current (DC) circuits and alternating current (AC) circuits are analogous but differ. In DC circuits, impedance corresponds to resistance, wherein voltage "V" equals the product of the current "I" and the resistance "R." In AC circuits, impedance can be more complicated, as it depends upon the combined effects of all of the circuitry components. For instance, inductors and capacitors accumulate voltages that oppose current flow of current, and these inductive and capacitive reactances are to be considered along with resistance in order to find the impedance.

As a material property, impedance represents the opposition of a material to current flow, and normally encompasses the effects of both conductivity and permittivity on the current flow. Properties of materials are usually expressed in "bulk" form. Testing of bulk material properties may involve, for instance, the placement of a large, homogeneous piece of material in an apparatus. Bulk material properties are useful for most but not all applications. Generally speaking, the term "thin film" is conventionally applied to a material layer that is very thin. Many so-called "thin films" range in thickness between fractions of a nanometer to several micrometers.

Testing of properties of a "thin" material is quite unlike testing of properties of a bulk material. As the thickness of a material approaches zero, the internal electrical interactions which determine its material properties change, and the "thin" material properties (e.g., "thin film" properties or "thin wire" properties) increasingly dominate. Generally speaking, the testing of "thin film" properties or "thin wire" properties for solid materials is easy and straightforward. In contrast, the testing of "thin film" properties for fluid materials is difficult and problematical, because surface tension controls the thickness of a pool of fluid. In the case of a bubble, for instance, it is difficult to test the fluid's properties without "bursting the bubble."

SUMMARY OF THE INVENTION

In view of the foregoing, an object of the present invention is to provide an improved methodology for measuring the electromagnetic impedance (conductivity and permittivity) of a thin film of fluid.

As typically practiced, the present invention provides for measurement of the electrical impedance, and/or of one or more electrical characteristics related to electrical impedance (e.g., the conductivity and/or the permittivity) of a thin film of fluid. Conventional measurement methodologies are hampered by their inability to overcome the unstable and delicate nature of their thin fluid samples, which are akin to easily burst bubbles. In contrast, the inventive methodology uniquely provides thin fluid samples that are stable and sturdy. Moreover, the present invention uniquely provides for measurement of in-plane and through-plane (normal-to-plane) electrical characteristics such as electrical impedance.

In accordance with typical practice of the present invention, electrical property measurement apparatus is provided for use in association with fluid material. The inventive apparatus includes a first electrically nonconductive structure, a second electrically nonconductive structure, a displacement device, and plural electrodes. The first electrically nonconductive structure has a first flat surface. The second electrically nonconductive structure has a second flat surface. The first electrically nonconductive structure and the second electrically nonconductive structure are rendered relatively movable by the displacement device so that the first flat surface and the second flat surface are variably separated while remaining parallel and opposite. Upon immersion of at least a portion of the inventive apparatus in a body of fluid, a sample of the fluid is delimited by the first flat surface and the second flat surface, and is electrifiable via the electrodes.

According to many embodiments of the inventive apparatus, the variable separation between the first flat surface and the second flat surface includes variable close separation between the first flat surface and the second flat surface. The sample that is delimited by the closely separated first flat surface and second flat surface constitutes a thin fluid film. The thin fluid film is characterized by a variable fluid film thickness corresponding to the variable close separation between the first flat surface and the second flat surface.

According to frequent inventive practice, the inventive apparatus is embodied to include a data acquisition system that includes a frequency generator and a processor-controller. The inventive apparatus is characterized by circuitry whereby: the frequency generator transmits test signals to the sample of the fluid via the electrodes; the transmission of the test signals by the signal generator is controlled by the processor-controller; data signals that are indicative of the electrical impedance of the sample of the fluid are processed by the processor-controller. The inventive apparatus can also be embodied to include one or more devices for pressurizing and/or depressurizing the fluid.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein like numbers indicate same or similar parts or components, and wherein:

FIG. 1 is an elevation view of an example of a pair of electrically nonconductive presses, in accordance with typical practice of the present invention.

FIG. 2 is an elevation view of the inventive presses shown in FIG. 1, and a fluid test region therebetween.

FIG. 3 through FIG. 5 are elevation views of examples similar to FIG. 2, illustrating varying distances between the inventive presses.

FIG. 6 and FIG. 7 exemplify geometries of inventive presses such as are depicted in FIG. 1 through FIG. 5.

FIG. 8 through FIG. 10 are each the view of FIG. 2, additionally showing in-plane measurement probes (FIG. 8 and FIG. 10) and through-plane measurement probes (FIG. 9 and FIG. 10), in accordance with typical practice of the present invention.

FIG. 21 illustrates inventive in-plane impedance measurement. FIG. 22 illustrates inventive through-plane impedance measurement. FIG. 23 illustrates both inventive in-plane impedance measurement and inventive through-plane impedance measurement.

FIG. 24 illustrates inventive in-plane impedance measurement. FIG. 25 illustrates inventive through-plane impedance measurement. FIG. 26 illustrates both inventive in-plane impedance measurement and inventive through-plane impedance measurement.

DESCRIPTION OF EXEMPLARY EMBODIMENTS OF THE INVENTION

Referring now to FIG. 1 through FIG. 5, two presses 100, viz., presses $100_1$ and $100_2$, are spaced apart from each other so that their respective flat (planar) surfaces 101 are separated from each other by a distance d. Each press 100 is an electrically nonconductive structure, and is preferably characterized by low electrical permittivity. Suitable electrically nonconductive materials for inventive presses 100 include, but are not limited to, those belonging to the following categories: plastics; ceramics; glass; solid resins; composites.

Press $100_1$ has a flat surface $101_1$; press $100_2$ has a flat surface $101_2$. Flat surfaces $101_1$ and $101_2$ are parallel to and opposite each other. Distance d is the perpendicular distance between the parallel flat surfaces $101_1$ and $101_2$, respectively, of the two opposing presses $100_1$ and $100_2$. As shown in FIG. 2 through FIG. 5, flat surfaces $101_1$ and $100_2$ delimit therebetween a quantity of fluid, fluid quantity q, which represents the fluid test sample of the inventive apparatus. At shorter distances d, fluid quantity q constitutes a "thin fluid film." Fluid quantity q is characterized by a fluid thickness t that equals or approximately equals the distance d between the two parallel flat surfaces 101 that border upon fluid quantity q.

According to typical inventive practice, distance d is variable at the discretion of the inventive practitioner. Distance d shown in FIG. 1 and FIG. 2 is the same; this distance d is smaller than distance d in FIG. 3 but is larger than distance d shown in FIG. 4, which is larger than distance d shown in FIG. 5. An inventive electrical property measurement apparatus as typically embodied provides for selectivity of the fluid thickness t to obtain various data. The inventively afforded testability of fluid material at various distances d can yield data informative about the relation of fluid thickness t to the electrical character (e.g., electrical impedance) of the fluid quantity q.

Figure 6:
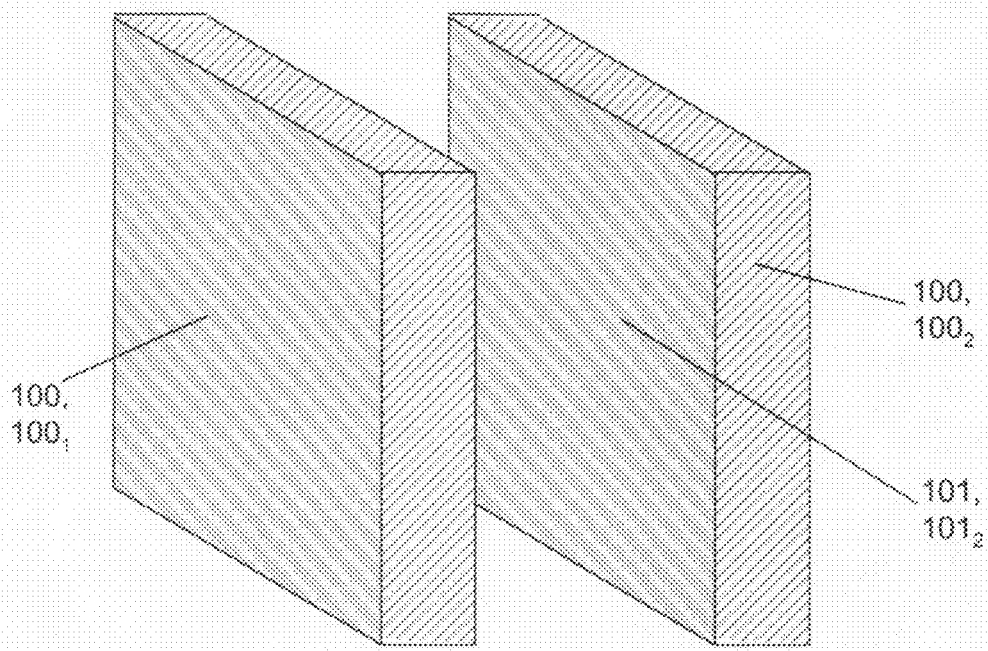
FIG. 6 and FIG. 7 are perspective views of inventive presses, having a rectangular prismatic shape and a cylindrical shape, respectively.
Figure 7:
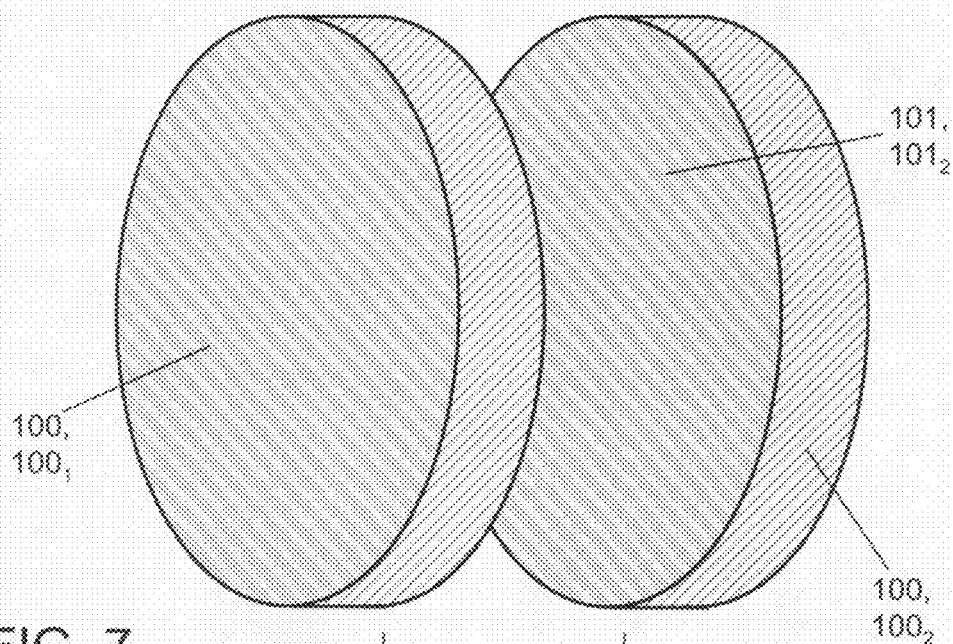

The present invention permits multifarious shapes of the presses 100. Each of the presses 100 shown in FIG. 1 through FIG. 5 can be understood to describe, for instance, a rectangular prismatic (or rectangular parallelepiped) shape such as shown in FIG. 6, or a cylindrical (e.g., disk) shape such as shown in FIG. 7. A rectangular prismatic press 100 geometry can be characterized by a square or non-square rectangular cross-section. A cylindrical press 100 geometry can be characterized by a circular, elliptical, or oval cross-section. Generally speaking, simpler shapes such as rectangular prisms and cylinders tend to be more practical than more complicated shapes, due to relative ease of fabrication and usage. Furthermore, uncomplicated three-dimensional geometric shapes that inherently possess flat surfaces will tend to suit inventive implementation.

Figure 20:
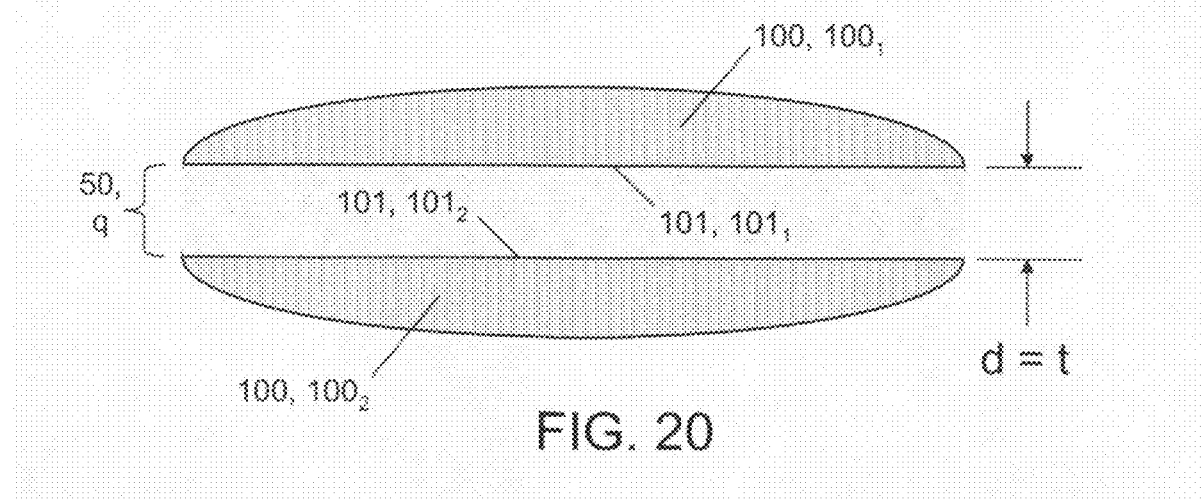
FIG. 20 is a view, interpretable as either an elevation view or a plan view, of an example of a pair of inventive presses characterized by curvature.

The two opposing curvilinear presses 100 shown in FIG. 20 serve merely to illustrate the importance of the two flat surfaces 101, and the relative unimportance of the press 100 geometries other than their two flat surfaces 101. The two important surfaces of the present invention's presses 100 are their respective flat surfaces 101, which are the "press surfaces" of the inventive methodology. Regardless of the overall geometries of the presses 100, their respective press surfaces 101 should be flat (planar) so that, when they approach each other in parallel at varyingly small distances d, the fluid quantities q that they capture between them constitute thin fluid films having varyingly small corresponding thicknesses t.

The present invention's paired presses $100_1$ and $100_2$ typically match each other in size and shape, but this is not necessary for inventive practice. Nor is it necessary that the two presses 100 have congruent press surfaces 101. The two press surfaces 101 should be flat (planar). Moreover, the two press surfaces 101 should be parallel to each other and oppose (face) each other so as to form a space between them that a fluid quantity q can occupy, such as interface 50 shown in FIG. 1 through FIG. 5. Interface 50 is the fluid test region of the inventive apparatus.

With reference to FIG. 8 through FIG. 10, two notable modes of inventive practice are "in-plane" mode and "through-plane" mode (also referred to herein as "normal-to-plane" mode). Interface 50, and hence the fluid quantity q that fills it, describes a geometric plane $p_I$, which is parallel to planar press surfaces $101_1$ and $101_2$. Geometric plane $p_T$ is perpendicular (normal) to geometric plane $p_I$. Electrical probe components 200 each include one or more probe elements, each of which serves as an electrode in the electrical circuitry represented by typical inventive practice.

According to the illustrated example of inventive "in-plane" measurement of electrical impedance (FIG. 8 and FIG. 10), two probe components $200_I$ are spaced apart from each other along geometric plane $p_I$, which is intermediate the two opposing press surfaces 101. As shown in FIG. 8 and FIG. 10, each probe component $200_I$ is midway or about midway between the two press surfaces 101. According to the illustrated example of inventive "through-plane" ("normal-to-plane") measurement of electrical impedance (FIG. 9 and FIG. 10), two probe components $200_T$ are spaced apart from each other along geometric plane $p_T$, which is perpendicular to geometric plane $p_I$. As shown in FIG. 9 and FIG. 10, each probe component $200_T$ is coupled with (e.g., "etched" into) a press 101 so as to be exposed at the press surface 101.

Reference now being made to FIG. 11 through FIG. 19, inventive practice admits of diverse configurations of the inventive electrical property measurement apparatus. Many inventive embodiments provide for mechanical movement of one press with respect to the other press, such as exemplified in FIG. 11 through FIG. 19 by a movable first press $100_1$ and a stationary second press $100_2$. In the light of the instant disclosure, the ordinarily skilled artisan will appreciate the applicability, to inventive practice, of the many different known mechanical mechanisms, fasteners and techniques for imparting relative motion between two bodies, including but not limited to those involving one, or some combination of two or more of, the following: crank; carriage; rack-and-pinion; slide; rail; track; slot; toggle joint; ratchet.

As shown in FIG. 11 through FIG. 19, crank mechanism 300 includes a crank handle 301 and a threaded rotatable crank axis 302. In each exemplary inventive embodiment, crank axis 302 has crank handle 301 at one axial end. Threaded crank axis 302 passes through and engages a threaded through-hole, such as axially horizontal threaded through-hole 402 shown in FIG. 11, FIG. 12 and FIG. 15, and such as axially vertical threaded through-hole 502 shown in FIG. 13, FIG. 14 and FIG. 16. At its other axial end, crank axis and is rotatably connected to movable press $100_1$, such as by a rotational joint 303 diagrammatically depicted in FIG. 11.

The geometric axis of crank axis 302 is perpendicular to geometric plane $p_I$, planar press surface $101_1$, and planar press surface $101_2$. Crank axis 302 is capable of axial linear displacement, back and forth, as indicated by bi-directional arrow c, so as to concomitantly move press $100_1$ so that moving press surface $101_1$ either approaches or recedes from, but remains parallel to, fixed press surface $101_2$. An inventive practitioner selectively turns (rotates) crank handle 201 either clockwise or clockwise as indicated by bi-directional arrow r, to impart the selected corresponding axial motion to press surface $101_1$.

FIG. 11 through FIG. 16 portray examples of inventive practice using a container such as a tank 400 for containing the fluid of interest, either liquid or gas. The term "tank" is broadly used herein, in the context of inventive practice, to refer to any suitable container, natural or man-made, for a fluid of interest. Generally speaking, the present invention, though practicable in association with either a liquid or a gas, is more propitiously practiced in association with a liquid. As depicted in FIG. 11 through FIG. 16, tank 400 has a base 403 and four vertical planar walls 401, one or more of which may be transparent (e.g., made of glass) according to some inventive embodiments. Vertical planar walls $401_1$ and $401_2$ are parallel to each other.

Figure 11:
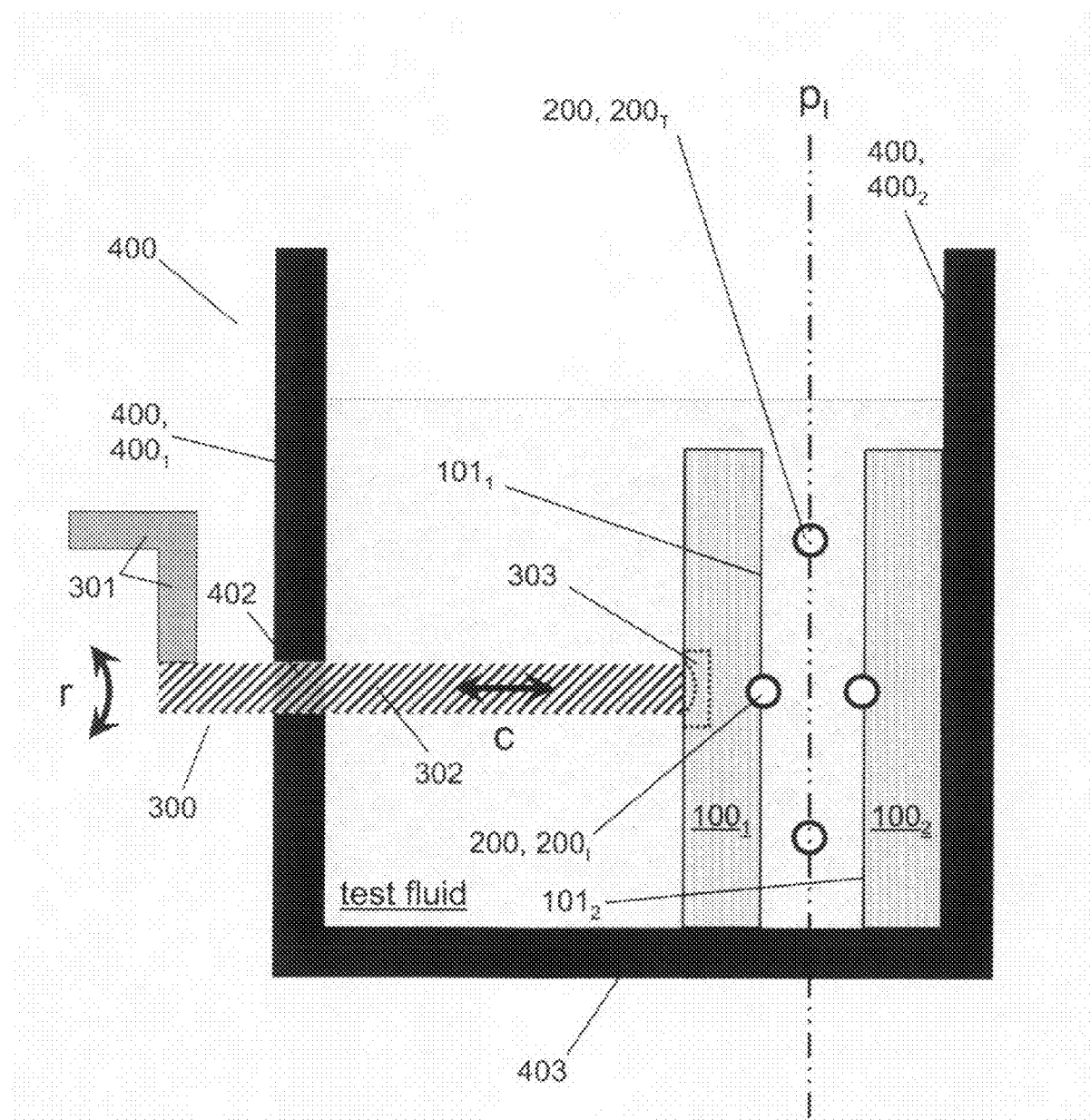
FIG. 11 and FIG. 12 are elevation views depicting examples of inventive apparatus embodiments in which the fluid test region describes a vertical geometric plane.
Figure 12:
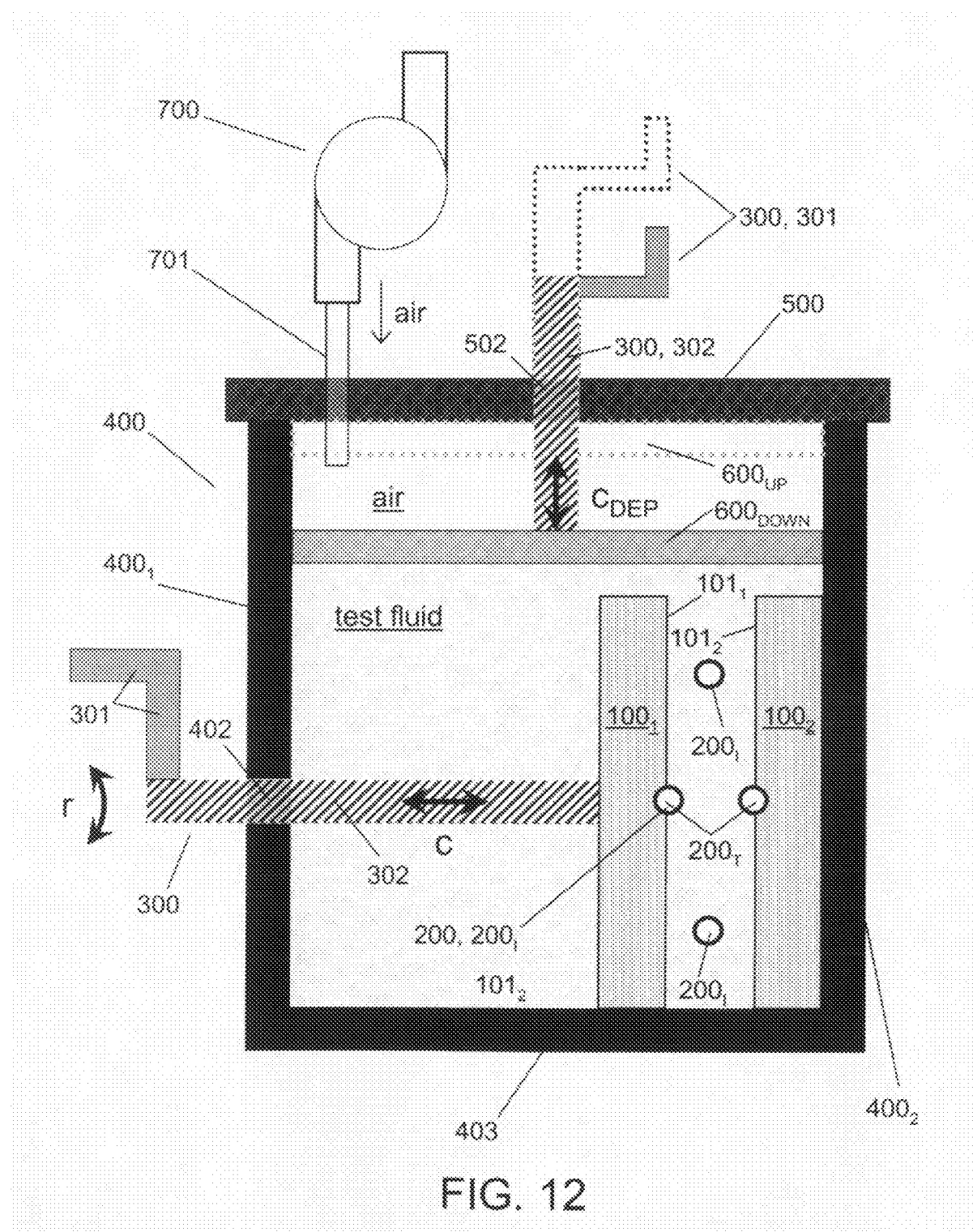
Figure 13:
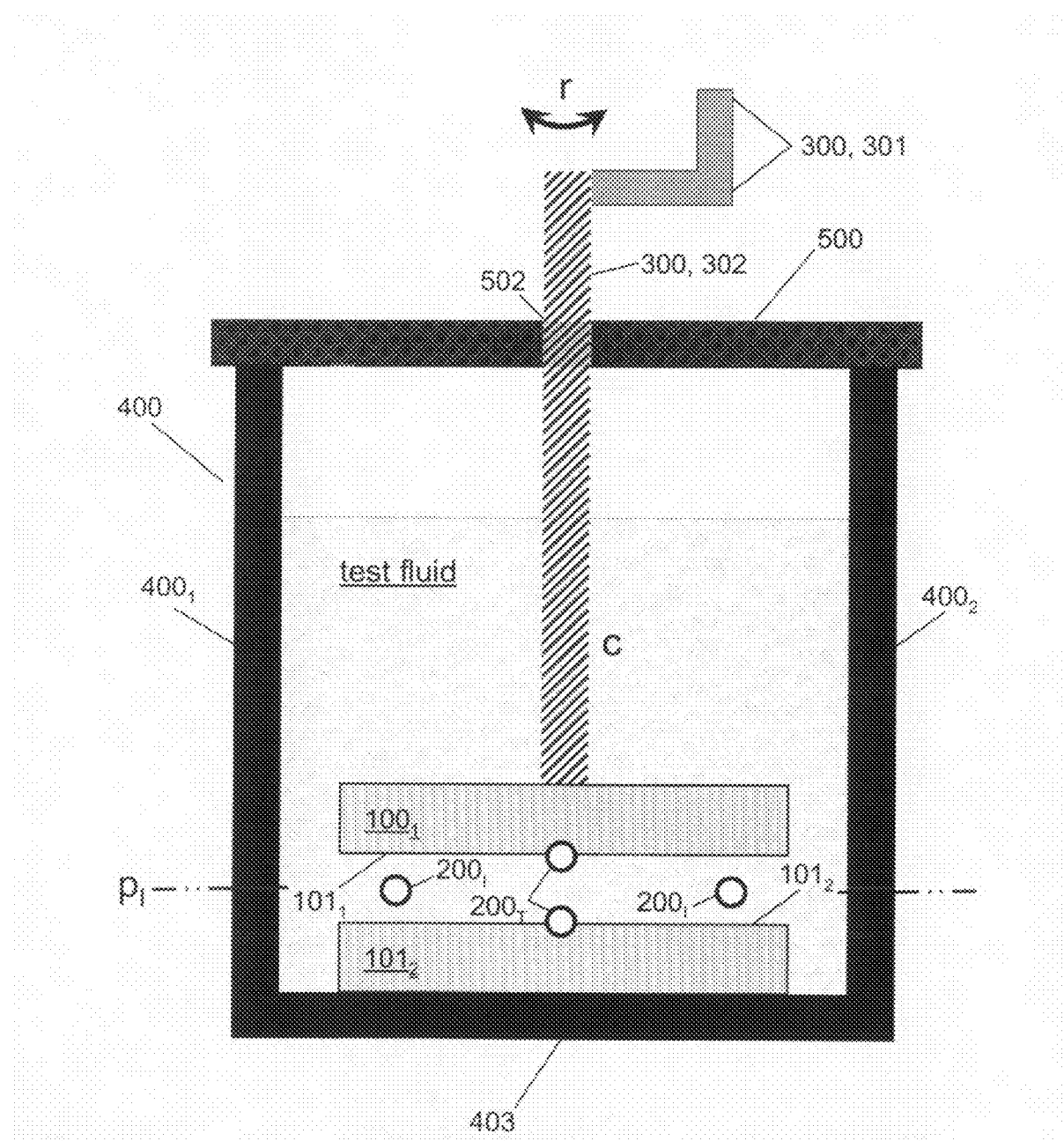
FIG. 13 and FIG. 14 are elevation views depicting examples of inventive apparatus embodiments in which the fluid test region describes a horizontal geometric plane.
Figure 14:
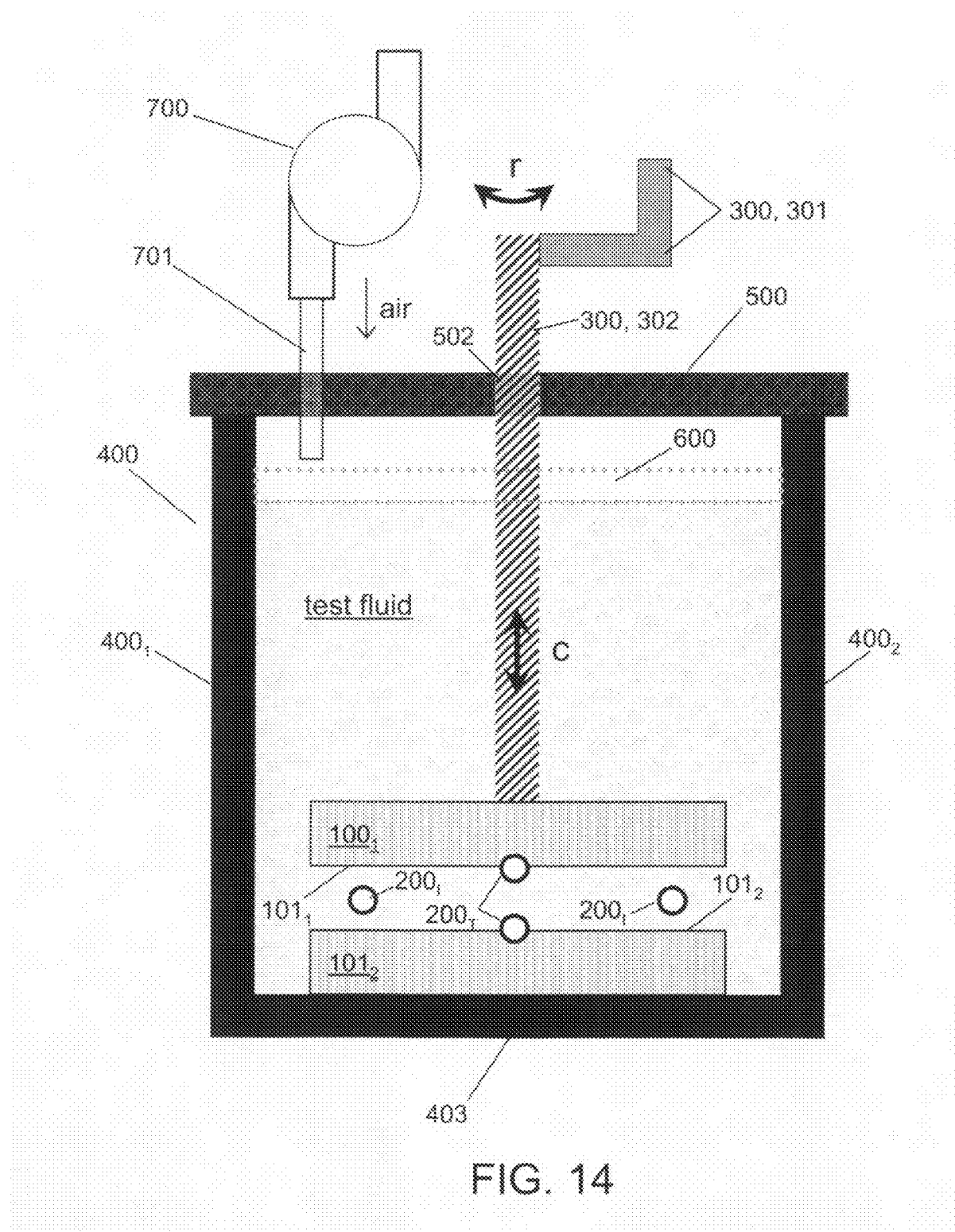
Figure 15:
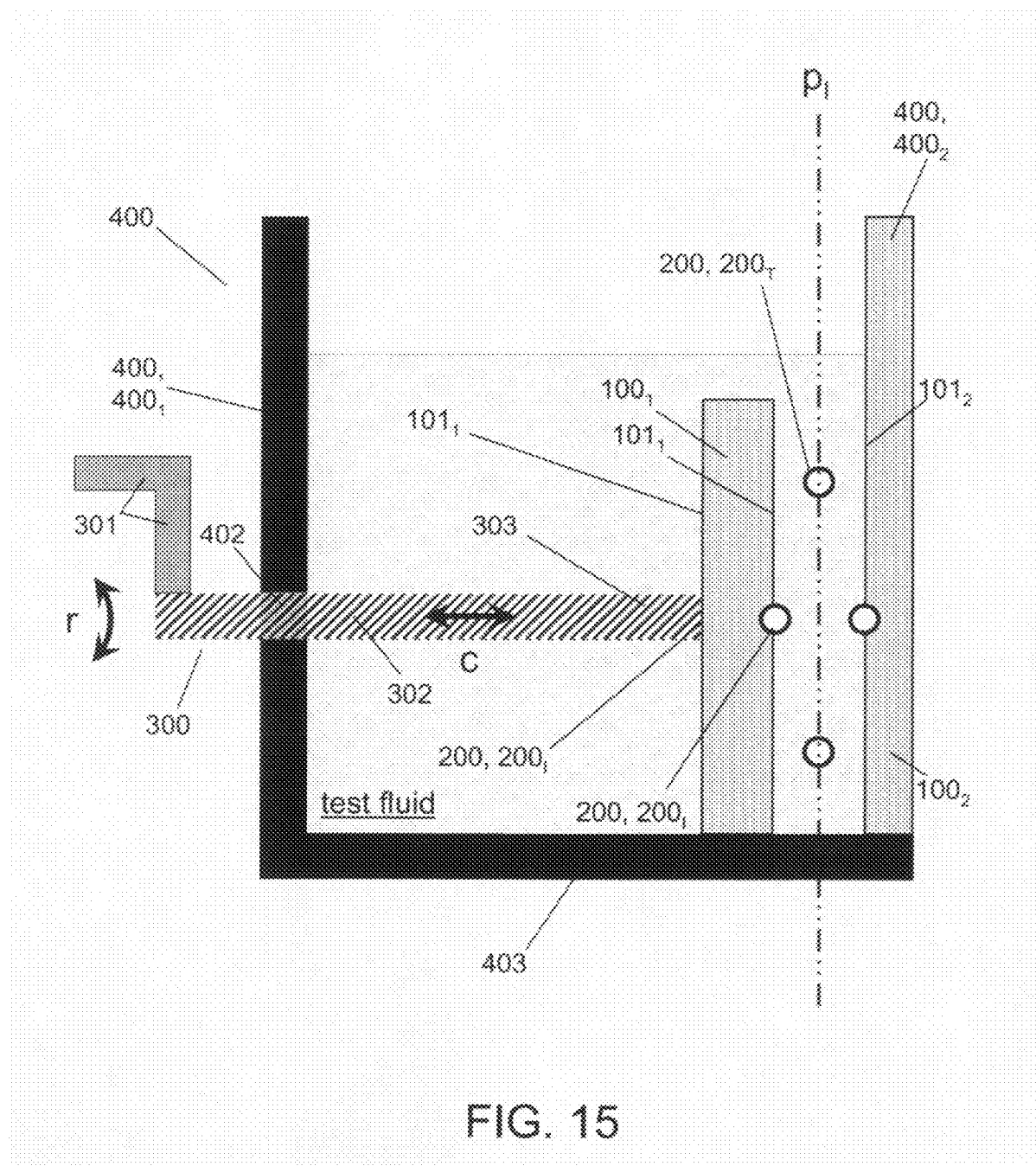
FIG. 15 is an elevation view depicting an example of an inventive apparatus embodiment similar to that depicted in FIG. 11, the main illustrated difference being that in FIG. 15 one of the presses is shown to be incorporated into the tank.
Figure 16:
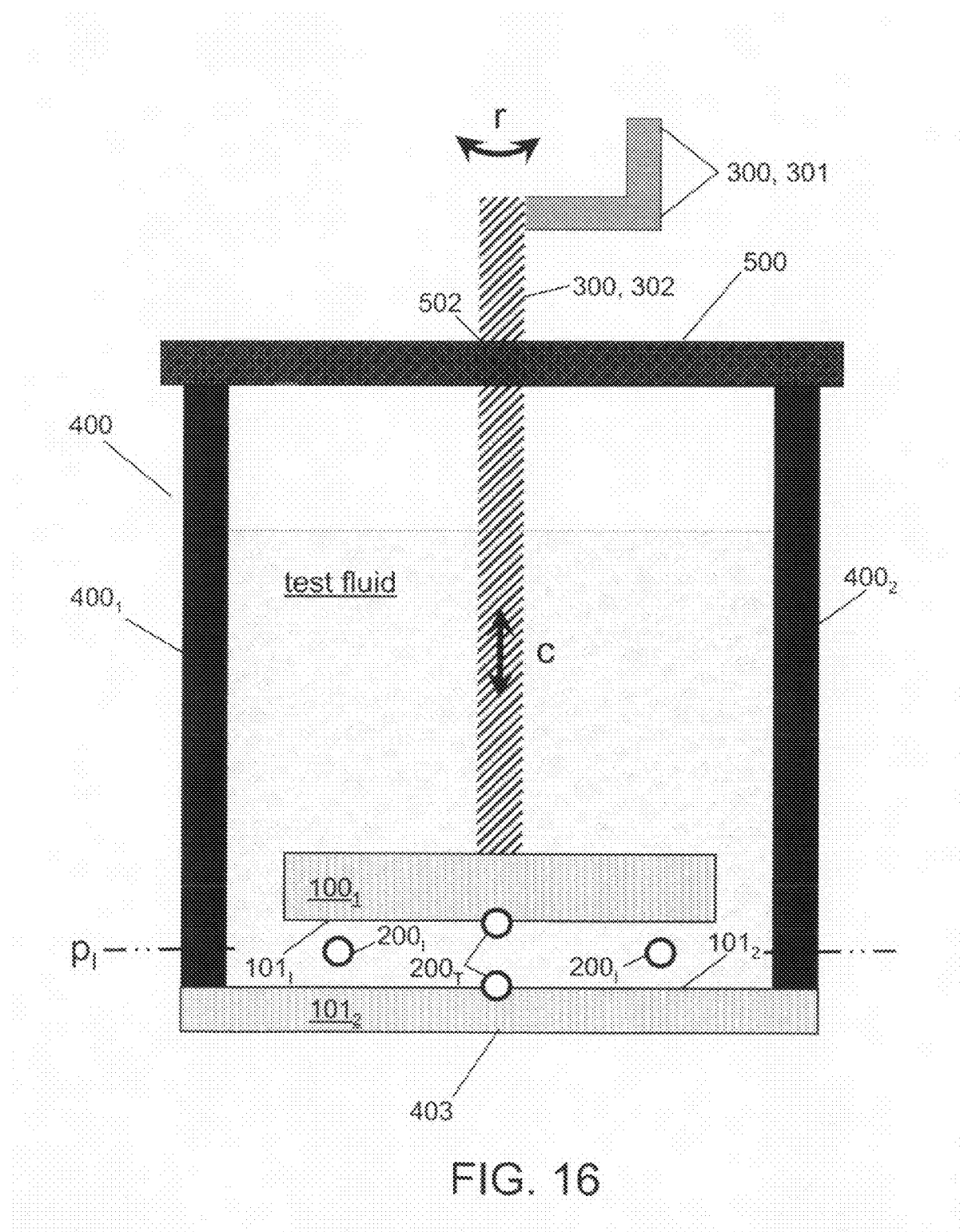
FIG. 16 is an elevation view depicting an example of an inventive apparatus embodiment similar to that depicted in FIG. 13, the main illustrated difference being that in FIG. 16 one of the presses is shown to be incorporated into the tank.

FIG. 11, FIG. 12, and FIG. 15 illustrate, by way of example, inventive embodiments in which the two parallel planar press surfaces $101_1$ and $101_2$ are vertical. FIG. 13, FIG. 14, and FIG. 16 illustrate, by way of example, inventive embodiments in which the two parallel planar press surfaces $101_1$ and $101_2$ are horizontal. Although the examples shown in FIG. 11 through FIG. 16 are illustrative of inventive embodiments in which a movable press surface is moved relative to a stationary press surface, it is to be understood that some inventive embodiments provide for movability of both press surfaces.

Tank 400 is shown in FIG. 11 through FIG. 16 to have a box shape (rectangular prismatic or rectangular parallelepiped), akin to a conventional aquarium tank. The ordinarily skilled artisan who reads the instant disclosure will appreciate that tank 400 can be variously shaped, depending on the inventive embodiment. A box-shaped tank 400 may frequently be advantageous in practicing the present invention. FIG. 11 through FIG. 16 demonstrate how the box shape of a tank 400 may facilitate both the mechanical mobility of press $100_1$ and the fixed attachment of press $100_2$.

As shown in FIG. 11, FIG. 12 and FIG. 15, vertical planar wall $401_1$ of tank 400 has provided therein an axially horizontal threaded through-hole 402, for engagement with axially horizontal threaded crank axis 302. Movable vertical press $100_1$ is movable toward and away (i.e., either toward or away) from fixed vertical press $100_2$ so that the movement can be selectively stopped to position vertical press $100_1$, thereby establishing a desired distance d between their respective flat surfaces $101_1$ and $101_2$. As shown in FIG. 11 and FIG. 12, fixed press $100_2$ is securely mounted on vertical planar tank wall $401_2$; as shown in FIG. 15, fixed press $100_2$ is, or is incorporated in, vertical planar tank wall $401_2$.

As shown in FIG. 13, FIG. 14 and FIG. 16, horizontal planar lid 500, resting or joined atop tank 400, has provided therein an axially vertical threaded through-hole 502, for engagement with axially vertical threaded crank axis 302. Movable horizontal press $100_1$ is movable toward and away (i.e., either toward or away) from fixed horizontal press $100_2$ so that the movement can be selectively stopped to position horizontal press $100_1$, thereby establishing a desired distance d between their respective flat surfaces $101_1$ and $101_2$. As shown in FIG. 13 and FIG. 14, fixed press $100_2$ is securely mounted on horizontal planar tank base 403; as shown in FIG. 16, fixed press $100_2$ is, or is incorporated in, horizontal planar tank base 403.

As previously discussed herein, impedance as a function of fluid thickness t can be measured in accordance with the present invention. Additionally or alternatively, impedance as a function of pressure can be measured in accordance with the present invention. For instance, as shown in FIG. 13, FIG. 14 and FIG. 16, a vertical planar lid 500 is provided for tank 400. The air pressure can be adjusted in space 456, which is below the lid 500 and above the fluid test sample sitting in tank 400. The physics will be such that the pressure in space 456 will tend to become the pressure in the fluid test sample.

The air pressure can be increased in space 456 such as via air pump 700 having nozzle 701 inserted through fluid-tight lid 500 and into space 456, shown in FIG. 12 and FIG. 14. The air pressure can be decreased in space 456 such as via fluid-tight horizontal planar depressurizer member 600. As shown in FIG. 12 and FIG. 14, lid 500 has provided therein an axially vertical threaded through-hole 502, for engagement with the axially vertical threaded crank axis 302 of crank mechanism 300, which moves depressurizer member 600 between its $600_{UP}$ position and its $600_{DOWN}$ position in a vertical direction $C_{DEP}$. Depressurization so as to achieve a vacuum or near-vacuum in space 456 above the upper surface of the test fluid body can be achieved by moving depressurizer member 600 to a lower position (such as the depicted $600_{DOWN}$ position), and then to a higher position (such as the depicted $600_{UP}$ position).

Figure 17:
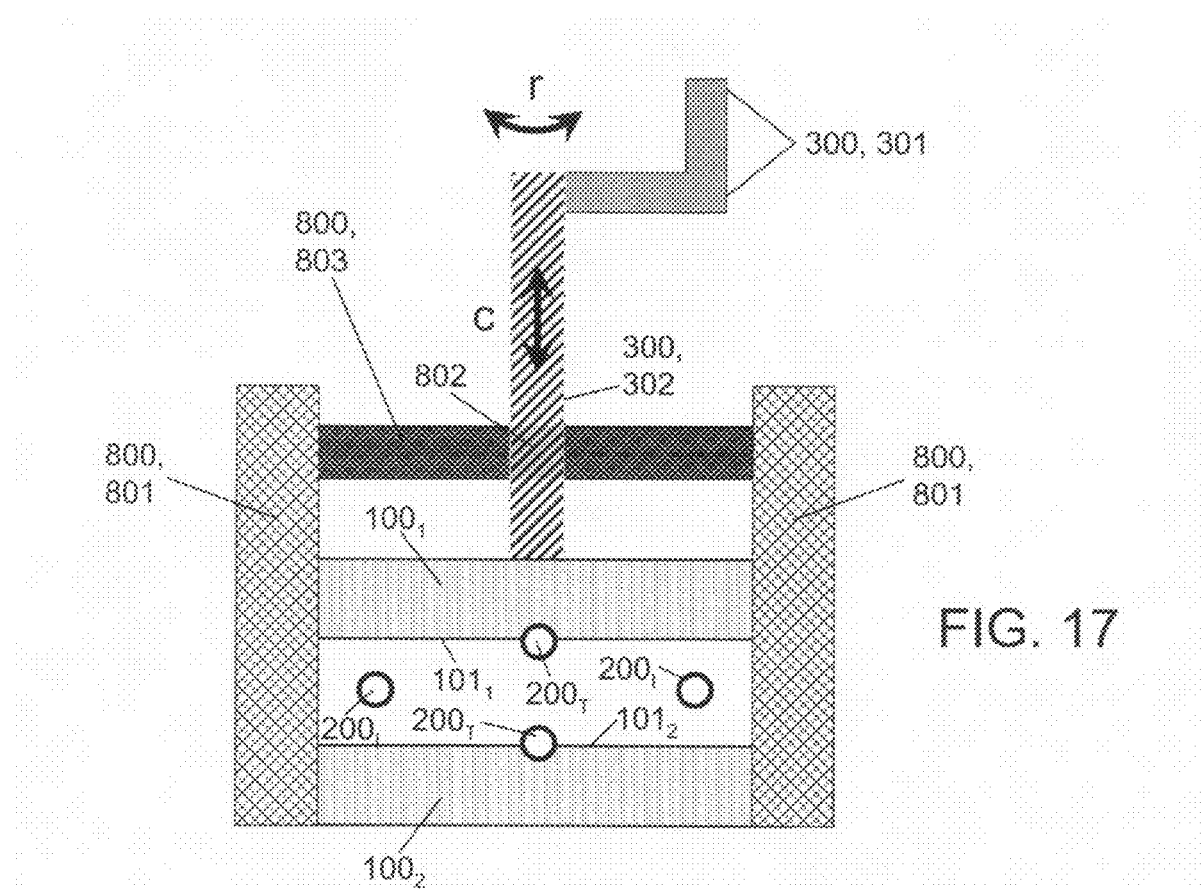
FIG. 17 is an elevation view of an example of a portable inventive unit that is suitable for selectively immersive use (e.g., in situ) in a body of water of interest.
Figure 18:
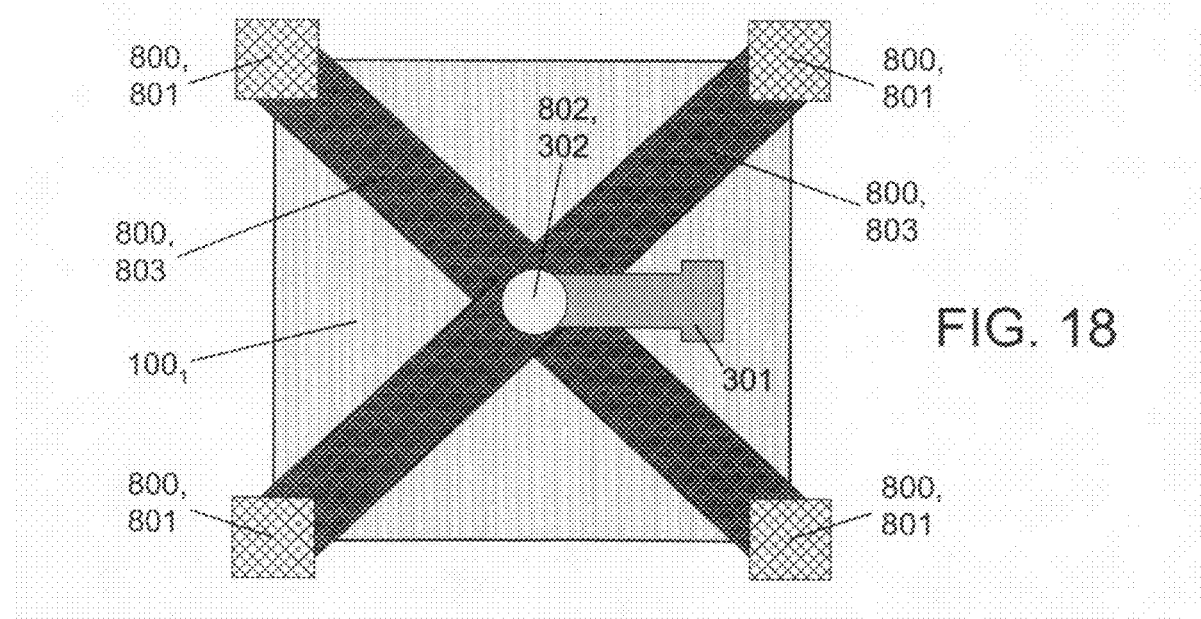
FIG. 18 is a top plan view of the portable inventive unit shown in FIG. 17.
Figure 19:
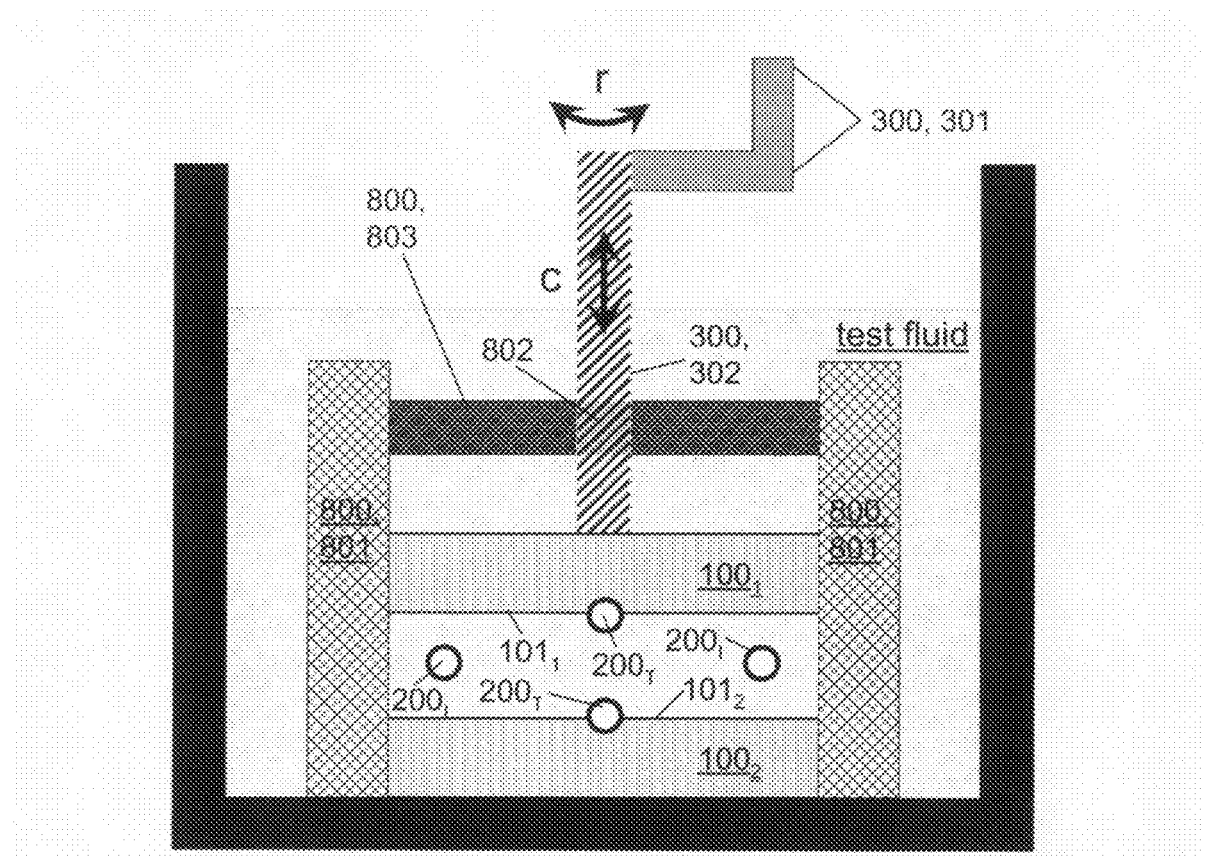
FIG. 19 is an elevation view of the portable inventive unit shown in FIG. 17, here shown submerged in a body of water, the fluid test region describing a horizontal geometric plane.

Reference now being made to FIG. 17 through FIG. 19, a mode of inventive practice affords "portability" in the sense that an inventive apparatus can be brought to a fluid body, however remote, for inventive on-site/in-the-field measurement. The exemplary inventive apparatus embodiment depicted in FIG. 17 through FIG. 19 includes a housing such as frame 800, which includes four vertical corner posts 801, and horizontal support 803 (which has an axially vertical threaded through-hole 802). The portable inventive apparatus also includes crank mechanism 300 (which engages through-hole 802), movable horizontal planar wall $401_1$, and fixed horizontal planar wall $401_2$. Horizontal press $100_1$ is supportively guided by posts 801, such as by slidable and settable engagement. Horizontal press $100_1$ can be moved toward or away from fixed horizontal press $100_2$ whereby movement can be selectively ceased and a desired distance d can be set.

As illustrated in FIG. 19, the portable inventive apparatus can be immersed in practically any fluid body of practically any description; containment of the ambient test fluid, in which the portable inventive apparatus is shown submerged, can be by practically any means, natural or artificial. It is reemphasized that, according to typical inventive practice, the geometries of the presses $100_1$ and $100_2$ are most important in terms of their respective press surfaces $101_1$ and $101_2$. For example, a portable inventive apparatus can be embodied so that the presses $100_1$ and $100_2$ are characterized by some degree of curvature in their surfaces other than their flat press surfaces $101_1$ and $101_2$, such as portrayed in FIG. 20.

Figure 21:
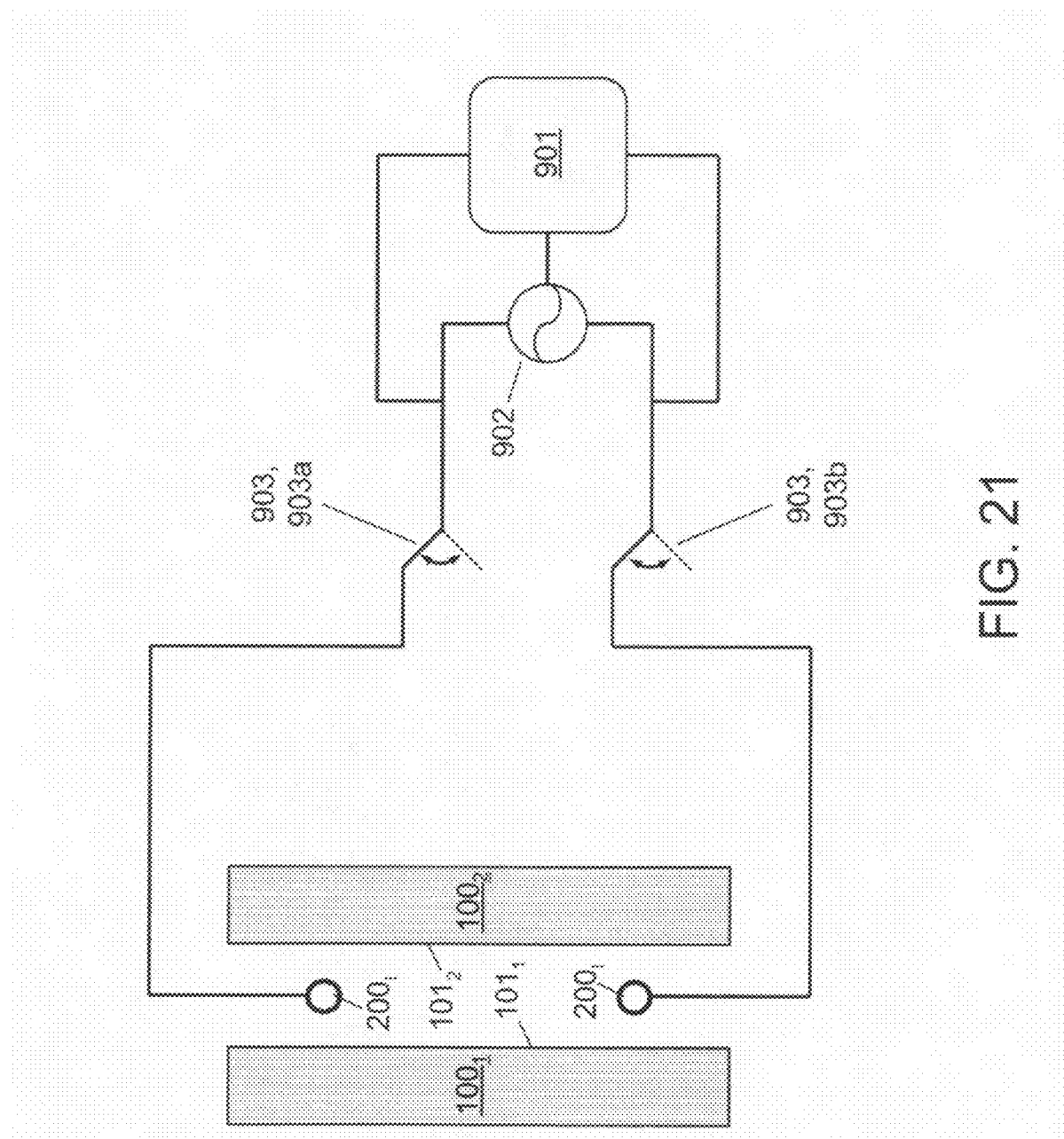
FIG. 21 through FIG. 23 are circuit diagrams of examples of inventive apparatus embodiments characterized by "double-switch" circuitry.
Figure 22:
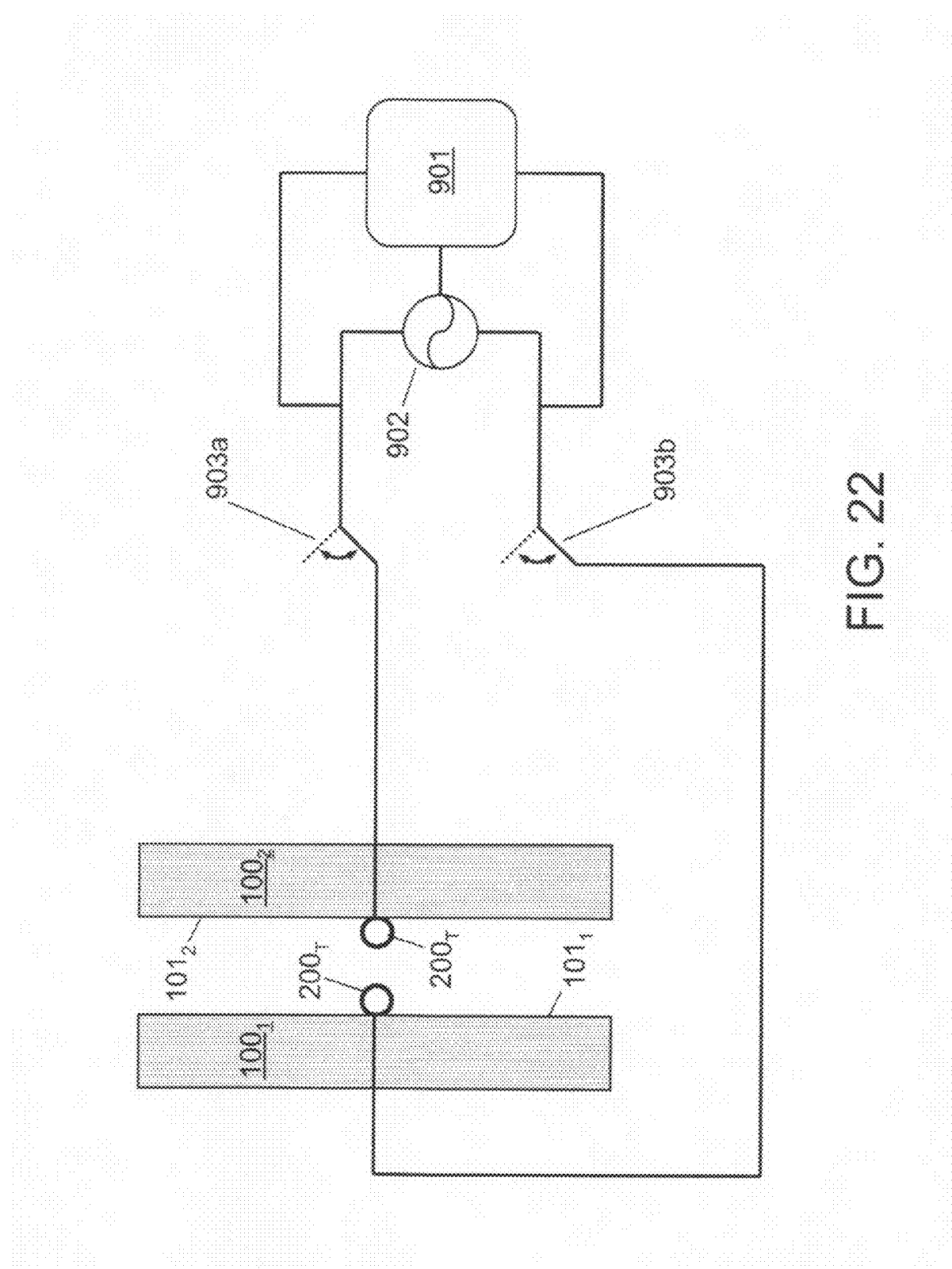
Figure 23:
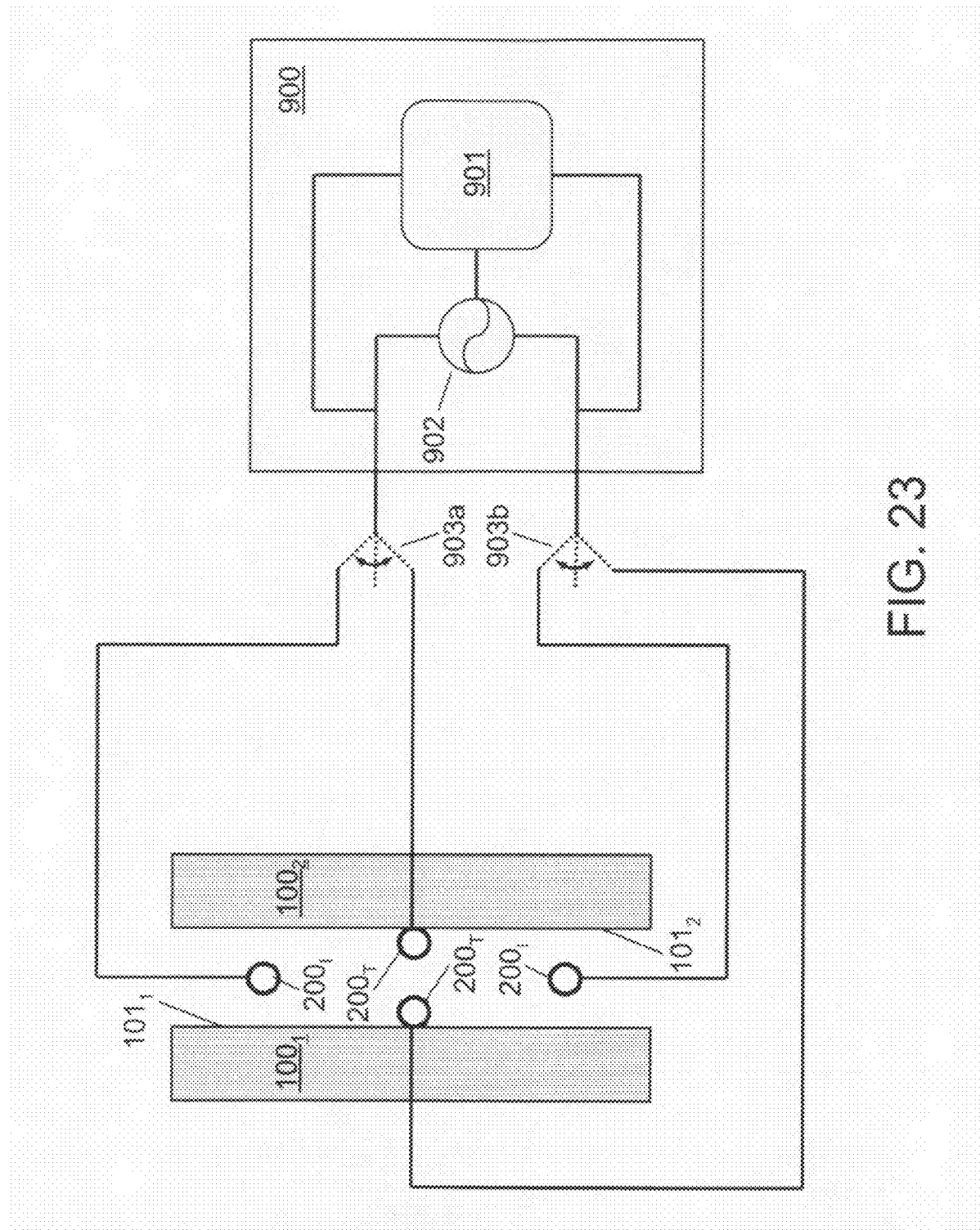
Figure 24:
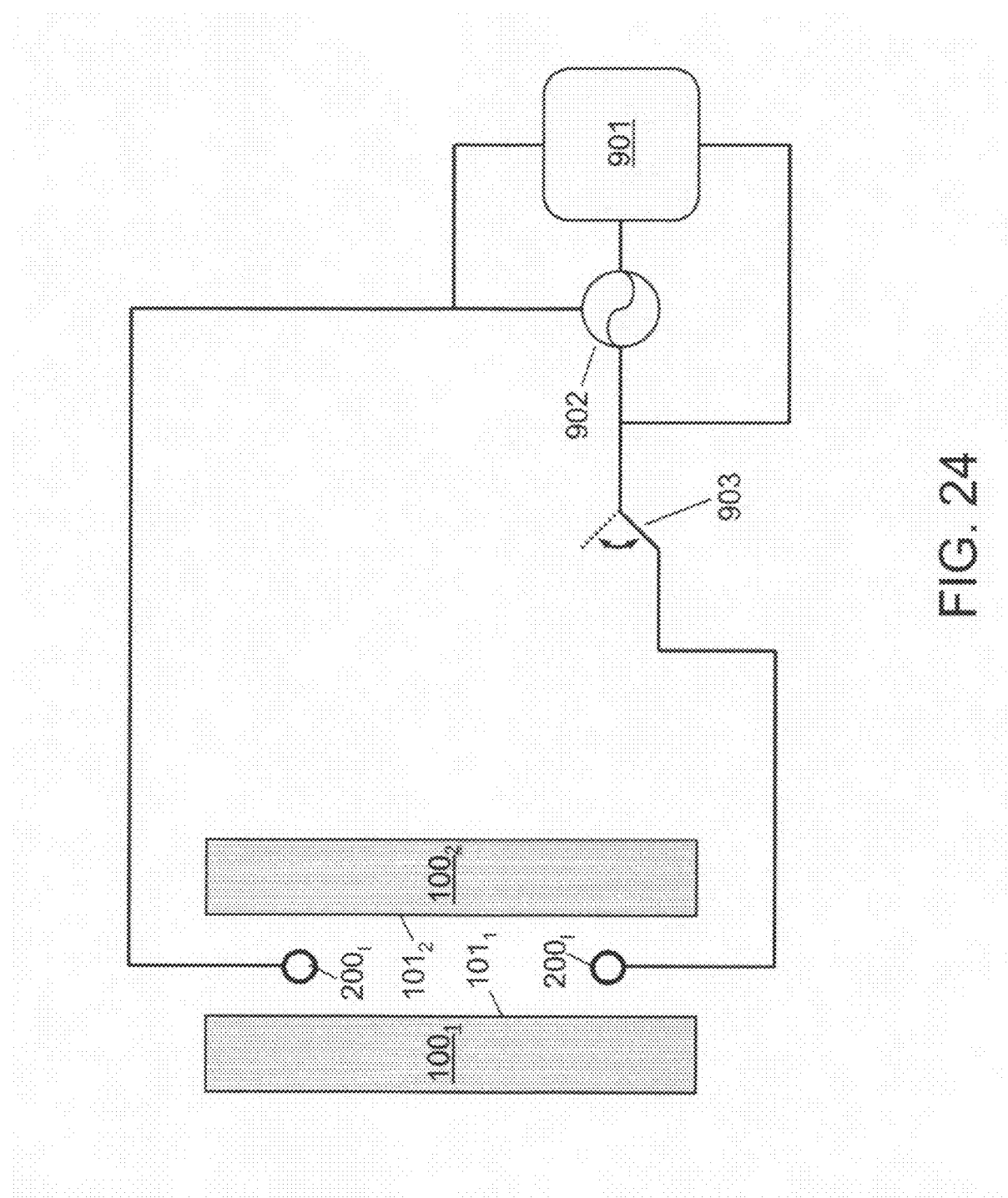
FIG. 24 through FIG. 26 are circuit diagrams of examples of inventive apparatus embodiments characterized by "single-switch" circuitry.
Figure 25:
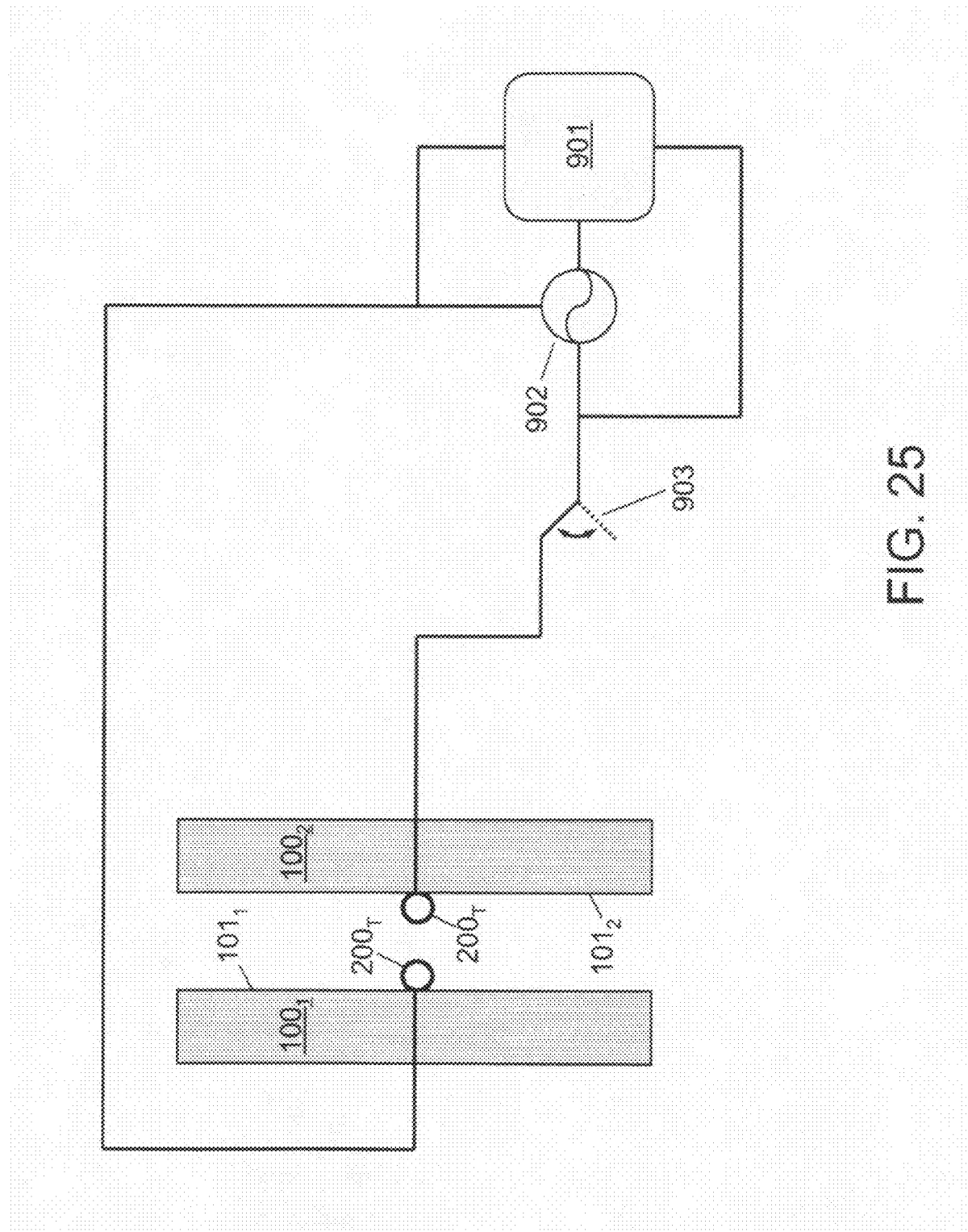
Figure 26:
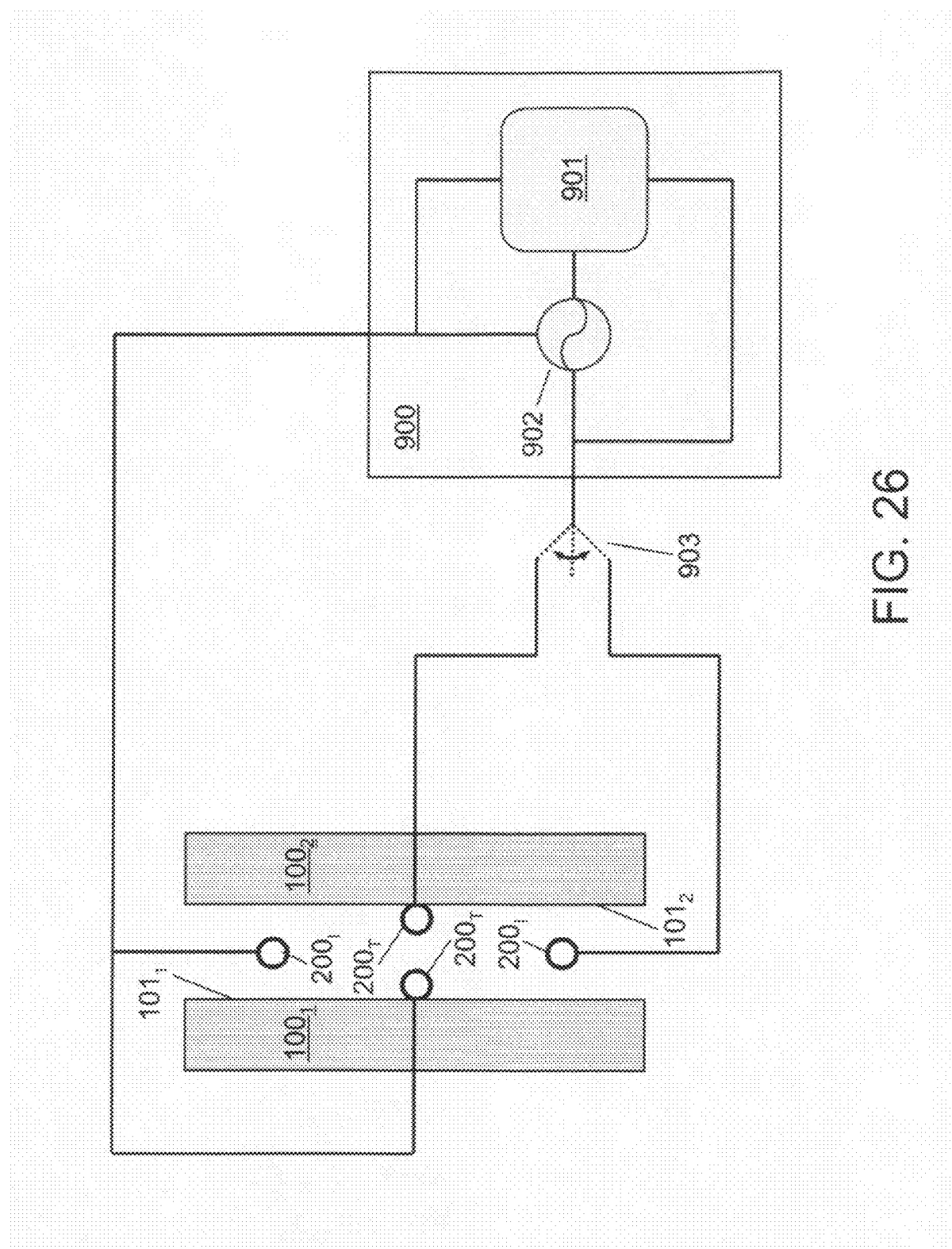

Now referring to FIG. 21 through FIG. 26, two principle modes of inventive measurement are in-plane measurement and through-plane (normal-to-plane) measurement. FIG. 21 and FIG. 24 show in-plane measurement using probes $200_I$. FIG. 22 and FIG. 25 show through-plane measurement using probes $200_T$. FIG. 23 and FIG. 26 show both in-plane measurement using probes $200_I$, and through-plane measurement using probes $200_T$. Each probe 200, whether an in-plane probe $200_I$ or a through-plane probe $200_T$, can be embodied to include either a single sensor-electrode device or plural sensor-electrode devices, depending on the inventive embodiment.

In typical inventive practice, usually situated external to the contained test fluid, are a computer processor-controller 901, an electrical signal generator (frequency generator) 902, and a switch device 903. Processor-controller 901 and signal generator 902 can be included in a data acquisition unit 900. Signal generator 902 creates desired electrical impulses. Processor-controller 901 controls the input signals transmitted by signal generator 902. Furthermore, processor-controller 901 processes the output signals transmitted by probes 200. Inventive apparatus can also be embodied so that processor-controller 901 controls the switching by switch device 903.

Switch device 903 accomplishes either or both of the following: (i) activating and deactivating signal generator 902 with respect to probes 200, such as shown in FIG. 21 through FIG. 26; (ii) switching between in-plane measurement mode and through-plane measurement mode, such as shown in FIG. 23 and FIG. 26. As exemplified in FIG. 23 and FIG. 26, switch device 903 determines whether the inventive apparatus operates in the in-plane mode (in which switch device 903 is set to energize in-plane probes $200_I$) or the through-plane mode (in which switch device 903 is set to energize through-plane probes $200_T$). FIG. 21 through FIG. 23 versus FIG. 24 through FIG. 26 represent two circuitous approaches according to inventive practice, the former exemplifying a double-switch approach (in which switch device 903 includes switch 903a and 903b), the latter exemplifying a single-switch approach.

The present invention uniquely accomplishes measurement of dc impedance or ac impedance of thin fluid films, especially thin liquid films. It will be apparent to the ordinarily skilled artisan who reads the instant disclosure that some known techniques pertaining to measurement of dc or ac impedance of thin solid films, such as involving Van der Pauw methodology, can be incorporated into practice of the present invention. Examples of literature informative about impedance measurement of thin solid films include the following references, each of which is hereby incorporated herein by reference: Nulman U.S. Pat. No. 5,698,989 issued 16 Dec. 1997; Verkuil U.S. Pat. No. 5,442,297 issued 16 Aug. 1995; Duffy et al. U.S. Pat. No. 3,660,250 issued 2 May 1972; L. J. van der Pauw, "A Method of Measuring Specific Resistivity and Hall Effect of Discs of Arbitrary Shape," *Philips Research Reports*, Volume 13, Number 1, February 1958, pages 1-9; L. J. van der Pauw, "A Method of Measuring the Resistivity and Hall Coefficient on Lamellae of Arbitrary Shape," *Philips Technical Review*, Volume 20, Number 8, 1958-1959, pages 220-224.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications and changes to the principles disclosed herein may be made by one skilled in the art without departing from the true scope and spirit of the present invention, which is indicated by the following claims.

What is claimed is:

1. Electrical property measurement apparatus for use in association with fluid material, the apparatus comprising a first electrically nonconductive structure, a second electrically nonconductive structure, a displacement device, and plural electrodes, said first electrically nonconductive structure having a first flat surface, said second electrically nonconductive structure having a second flat surface, said first electrically nonconductive structure and said second electrically nonconductive structure being rendered relatively movable by said displacement device so that said first flat surface and said second flat surface are variably separated while remaining parallel and opposite, wherein upon immersion of at least a portion of the apparatus in a body of fluid, a sample of the fluid is delimited by said first flat surface and said second flat surface and is electrifiable via said electrodes.

2. The apparatus of claim 1, wherein:
   the variable separation between said first flat surface and said second flat surface includes variable close separation between said first flat surface and said second flat surface;
   the sample that is delimited by the closely separated said first flat surface and said second flat surface constitutes a thin fluid film;
   the thin fluid film is characterized by a variable fluid film thickness corresponding to the variable close separation between said first flat surface and said second flat surface.

3. The apparatus of claim 2, wherein the fluid is a liquid.

4. The apparatus of claim 3, further comprising a data acquisition system including a frequency generator and a processor-controller, the apparatus being characterized by circuitry whereby:

said frequency generator transmits test signals to the sample of the fluid via said electrodes;

the transmission of the test signals by the signal generator is controlled by said processor-controller;

data signals that are indicative of the electrical impedance of the sample of the fluid are processed by said processor-controller.

5. The apparatus of claim 4, further comprising at least one of:

means for pressurizing the fluid;

means for depressurizing the fluid.

6. An apparatus for measuring the electrical impedance of a fluid, the apparatus comprising:

a pair of presses, each said press having a planar surface;

an adjustable support mechanism, for securing at least one said press so that said planar surfaces remain parallel to and facing each other, and so that the distance between said planar surfaces can be changed; and an impedance sensing device, for sensing the electrical impedance of a quantity of fluid that is situated between said planar surfaces.

7. The apparatus of claim 6, wherein:

the distance between said planar surfaces is selectable, both increasingly and decreasingly, so that the quantity of fluid that is situated between said planar surfaces is correspondingly characterized by a selected thickness;

at least some of the selectable distances between said planar surfaces, the quantity of fluid that is situated between the proximate said planar surfaces describes a thin film of the fluid.

8. The apparatus of claim 6, wherein said presses are electrically nonconductive, and wherein the fluid is a liquid.

9. The apparatus of claim 6, wherein:

the apparatus further comprises a tank for containing fluid;

one said press is fixedly attached to said tank inside said tank;

said adjustable support mechanism is capable of moving the unattached said press relative to the fixedly attached said press;

when said presses are at least partially submerged in the fluid that is contained by said tank, a portion of the fluid that is contained by the tank is the quantity of fluid that is situated between said planar surfaces.

10. The apparatus of claim 9, further comprising a fluid-tight lid for said tank, and at least one of:

means for pressurizing the fluid that is contained by said tank;

means for depressurizing the fluid that is contained by said tank.

11. The apparatus of claim 9, wherein:

said adjustable support mechanism includes a lid for said tank;

said lid has a threaded hole;

said planar surface of the fixedly attached said press is horizontal;

said adjustable support mechanism includes a threaded crank axis for:

vertical placement through and engagement with said threaded hole;

connection to and vertical movement of the unattached said press so that said planar surface of the unattached said press remains horizontal.

12. The apparatus of claim 9, wherein:

said adjustable support mechanism includes said tank;

said tank has a threaded hole;

said planar surface of the fixedly attached said press is vertical;

said adjustable support mechanism includes a threaded crank axis for:

horizontal placement through and engagement with said threaded hole;

connection to and horizontal movement of the unattached said press so that said planar surface of the unattached said press remains vertical.

13. The apparatus of claim 6, wherein said adjustable support mechanism is for securing both said presses with respect to each other, and wherein said adjustable support mechanism and said presses are capable of being at least partially submerged in a fluid body so that a portion of the fluid body is the quantity of fluid that is situated between said planar surfaces.

14. The apparatus of claim 6, the apparatus further comprising an input signal generator, for transmitting electrical input signals to said impedance sensing device.

15. The apparatus of claim 14, the apparatus further comprising a processor-controller, for controlling the transmission by said input signal generator of the electrical input signals, and for processing electrical output signals received from said impedance sensing device.

16. The apparatus of claim 6, wherein:

the fluid that is situated between said planar surfaces describes a geometric plane;

said impedance sensing device is capable of sensing the electrical impedance in a direction along the geometric plane that is described by the quantity of fluid that is situated between said planar surfaces;

said impedance sensing device includes a pair of probe components for placement between said planar surfaces and aligned with each other in a direction along the geometric plane that is described by the quantity of fluid that is situated between said planar surfaces.

17. The apparatus of claim 6, wherein:

the fluid that is situated between said planar surfaces describes a geometric plane;

said impedance sensing device is capable of sensing the electrical impedance in a direction perpendicular to the direction of the geometric plane that is described by the quantity of fluid that is situated between said planar surfaces;

the impedance sensing device includes a pair of probe components for respective placement at said planar surfaces so that said probe components are aligned with each other in a direction perpendicular to the direction of the geometric plane that is described by the quantity of fluid that is situated between said planar surfaces.

* * * * *